United States Patent
Fastow (10) Patent No.: US 6,998,677 B1
(45) Date of Patent: Feb. 14, 2006

(54) SEMICONDUCTOR COMPONENT AND METHOD OF MANUFACTURE

(75) Inventor: Richard M. Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 10/795,924

(22) Filed: Mar. 8, 2004

(51) Int. Cl.
*H01L 31/113* (2006.01)

(52) U.S. Cl. .......................... 257/330; 437/40; 437/41; 437/43; 437/48; 437/49; 437/50; 437/52

(58) Field of Classification Search .................. 437/40, 437/41, 43, 48, 49
See application file for complete search history.

(56) References Cited

U.S. PATENT DOCUMENTS

| | | | |
|---|---|---|---|
| 5,045,490 A | * | 9/1991 | Esquivel et al. ............ 438/259 |
| 5,173,436 A | * | 12/1992 | Gill et al. .................... 438/262 |
| 6,449,188 B1 | | 9/2002 | Fastow |
| 6,525,368 B1 | | 2/2003 | Fastow |
| 6,525,959 B1 | * | 2/2003 | Fastow .................. 365/185.01 |
| 6,552,435 B1 | | 4/2003 | Noble |
| 6,573,137 B1 | | 6/2003 | Divakaruni et al. |
| 6,583,479 B1 | | 6/2003 | Fastow et al. |

* cited by examiner

*Primary Examiner*—Mai-Huong Tran
(74) *Attorney, Agent, or Firm*—Paul Drake; Rennie Wm. Dover

(57) ABSTRACT

A semiconductor component having a memory cell coupled to a trench line and a method for manufacturing the semiconductor component. Trenches having sidewalls are formed in a semiconductor substrate and a trench line is formed in each trench. A polysilicon insert is formed between the trench line and each sidewall of the trench. A column of memory cells is formed between the trenches where each memory cell of the column of memory cells has a gate structure, a source region, and a drain region. The source regions of the column of memory cells are electrically coupled to the trench line on one side of the column of memory cells via one of the polysilicon inserts. The drain regions of the column of memory cells are electrically coupled to the trench line adjacent the opposite side of the column of memory cells via another of the polysilicon inserts.

22 Claims, 5 Drawing Sheets

SEMICONDUCTOR COMPONENT AND METHOD OF MANUFACTURE

FIELD OF THE INVENTION

This invention relates, in general, to memory devices and, more particularly, to memory devices having a flash architecture.

BACKGROUND OF THE INVENTION

Memory devices are used in a variety of electronic systems including computers, cellular phones, pagers, personal digital assistants, avionic systems, automotive systems, industrial control systems, appliances, etc. Depending on the particular system configuration, the memory devices may be either non-volatile or volatile. A non-volatile memory device retains the data or instructions stored therein when the device is turned off or power is removed. A volatile memory device, on the other hand, does not retain the stored data or instructions when the device is turned off. Flash memory has become an important type of non-volatile memory because it is less expensive to manufacture and denser than most other types of memory devices. In addition, Flash memory is electrically erasable and has a life span of up to one million write cycles.

Figure 1:
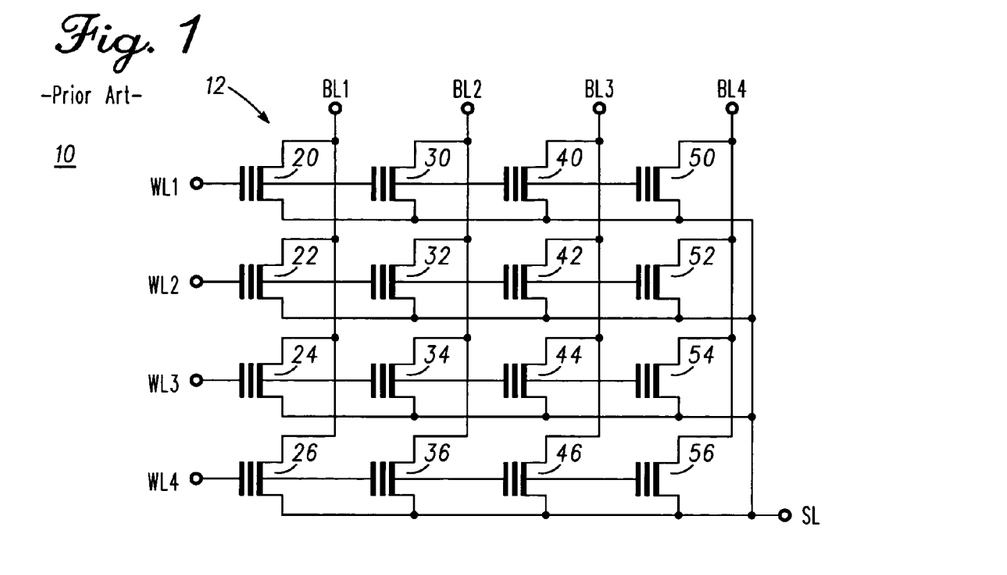
FIG. 1 is a schematic diagram of a prior art memory array.

Memory systems such as flash memory are typically configured on a semiconductor chip such that high density memory arrays occupy a central portion of the chip and lower density control and logic circuitry are placed along peripheral portions of the chip. The high-density memory arrays are typically comprised of memory cells arranged in columns and rows. FIG. 1 is a schematic diagram illustrating a prior art memory array 10 in a NOR type circuit architecture. Memory array 10 comprises an array of memory cells 12 arranged in columns and rows, where each memory cell has a control gate terminal, a drain terminal, and a source terminal. Memory cells 20, 22, 24, and 26 form a column. Their drain terminals connect to a bit line BL1 and their source terminals connect to a source line SL. Likewise, memory cells 30, 32, 34, and 36 form a column wherein their drain terminals connect to bit line BL2 and their source terminals connect to source line SL. Memory cells 40, 42, 44, and 46 form a column in which their drain terminals connect to bit line BL3 and their source terminals connect to source line SL. Memory cells 50, 52, 54, and 56 form a column in which their drain terminals connect to bit line BL 4 and their source terminals connect to source line SL.

The gate terminals of memory cells 20, 30, 40, and 50 connect to a word line WL1. Likewise, the gate terminals of memory cells 22, 32, 42, and 52 connect to a word line WL2; the gate terminals of memory cells 24, 34, 44, and 54 connect to a word line WL3; and the gate terminals of memory cells 26, 36, 46, and 56 connect to a word line WL4.

A drawback with this type of memory array configuration is the amount of silicon area it consumes. One reason this type of memory array configuration consumes a large silicon area is that one drain contact is required for every two memory cells.

Accordingly, what is needed is a memory device and a cost-effective method for manufacturing a memory device that increases the density of the memory cells of the memory array.

SUMMARY OF THE INVENTION

The present invention satisfies the foregoing need by providing a memory device and a method for manufacturing the memory device that increases the density of the memory cells. In accordance with one aspect, the present invention is a memory device comprising a substrate in which a trench is formed. The trench has first and second sidewalls and a floor. A first column of memory cells is adjacent the first sidewall of the trench. A trench line is disposed in the trench and is electrically coupled to the first column of memory cells.

In accordance with another aspect, the present invention comprises a memory device comprising first and second memory cells that cooperate to form a column of memory cells. Each of the first and second memory cells has a gate structure, a drain region, and a source region. The source region of the second memory cell is coupled to the source region of the first memory cell. A trench line is adjacent to the first column of memory cells. The source regions of the first and second memory cells are coupled to the trench line.

In accordance with yet another aspect, the present invention comprises a method for manufacturing a semiconductor component. A semiconductor substrate having a major surface is provided. A trench is formed in the semiconductor substrate, extends from the major surface into the semiconductor substrate, and has first and second sidewalls and a floor. A trench line is formed in the trench and inserts are formed between the trench line and the first and second sidewalls of the trench. A first doped region is formed in a portion of the semiconductor substrate adjacent the first sidewall of the first trench. A second doped region is formed in another portion of the semiconductor substrate adjacent the first sidewall of the trench, electrically connecting the trench to either the source or drain regions of the cell.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Figure 2:
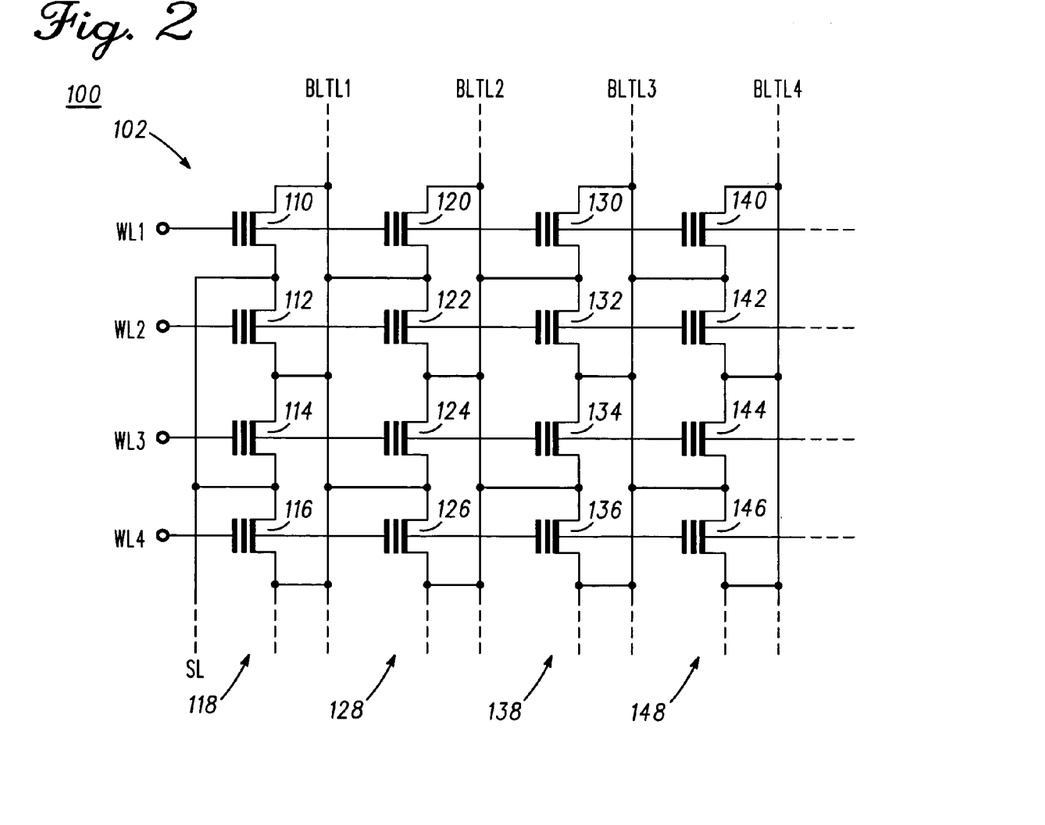
FIG. 2 is a schematic diagram of a portion of a memory array in accordance with an embodiment of the present invention.

FIG. 2 is a schematic diagram illustrating a sub-array 100 of a memory array in a NOR type circuit architecture in accordance with an embodiment of the present invention. Sub-array 100 is a 4×4 sub-array of memory cells 102 arranged in columns and rows, where each memory cell of sub-array 100 has a drain terminal, a source terminal, and a gate terminal. It should be understood that the size of sub-array 100 or the size of the array of memory cells is not a limitation of the present invention. For example, sub-array 100 can be a portion of an 8×8 array of memory cells, a 16×16 array of memory cells, 32×32 array of memory cells, a 64×64 array of memory cells, a 128×128 array of memory cells, a 256×256 array of memory cells, a 512×512 array of memory cells, a 1024×1024 array of memory cells, etc.

The columns of memory cells 102 are arranged along respective bit/trench lines BLTL1, BLTL2, BLTL3, BLTL4, etc. Memory cells 110, 112, 114, and 116 of memory cell array 100 form a column 118 of memory cells along bit line BLTL1. Memory cells 120, 122, 124, and 126 of memory cell array 100 form a column 128 of memory cells along bit line BLTL2. Memory cells 130, 132, 134, and 136 of memory cell array 100 form a column 138 of memory cells along bit line BLTL3. Memory cells 140, 142, 144, and 146 of memory cell array 100 form a column 148 of memory cells along bit line BLTL4.

The drain terminals of memory cells 110, 112, 114, and 116 are connected to bit line BLTL1 and the source terminals of memory cells 110, 112, 114, and 116 are connected to a source line SL. The drain terminals of memory cells 120, 122, 124, and 126 are connected to bit line BLTL2 and the source terminals of memory cells 120, 122, 124, and 126 are connected to bit line BLTL1. The drain terminals of memory cells 130, 132, 134, and 136 are connected to bit line BLTL3 and the source terminals of memory cells 130, 132, 134, and 136 are connected to bit line BLTL2. The drain terminals of memory cells 140, 142, 144, and 146 are connected to bit line BLTL4 and the source terminals of memory cells 140, 142, 144, and 146 are connected to bit line BLTL3.

The gate terminals of memory cells 110, 120, 130, and 140 are connected to word line WL1. The gate terminals of memory cells 112, 122, 132, and 142 are connected to word line WL2. The gate terminals of memory cells 114, 124, 134, and 144 are connected to word line WL3. The gate terminals of memory cells 116, 126, 136, and 146 are connected to word line WL4.

In operation, a memory cell is selected and programmed, read, or erased by applying the appropriate voltages to the gate, drain, and source terminals of the desired memory cell. The desired memory cell is selected or accessed by applying high voltages to the word line and to the bit line to which the respective gate and drain terminals of the desired memory cell are connected. And, applying a low voltage to the remaining word lines and bit lines. For example, if it is desired to select or access memory cell 122 shown in FIG. 2, a high voltage is applied to word line WL2 and a high voltage is applied to bit line BLTL2, and a low voltage is applied to word lines WL1, WL3, and WL4 and to bit lines BLTL1, BLTL3, and BLTL4, and to source line SL. In addition to selecting the desired memory cell, the voltages applied to the word lines, bit lines, and source line either program, read, or erase the selected memory cell. For example, memory cell 122 is programmed by applying a voltage ranging from about 5 volts to about 15 volts to word line WL2, connecting bit line BLTL1 to ground, and applying a voltage to bit line BLTL2 that is sufficiently higher than the voltage applied to bit line BLTL1 (i.e., the voltage applied to the source terminal of memory cell 122) to cause electrons to become trapped in the floating gate of memory cell 122.

Memory cell 122 is read by applying a control voltage to word line WL2 that is greater than the threshold voltage of an unprogrammed or erased memory cell, but less than the threshold voltage of a programmed memory cell. In addition, a ground potential is connected to bit line BLTL1 and a voltage ranging from about one volt to about two volts is applied to bit line BLTL2. Because word line WL2 is connected to the control gate of memory cell 122, the voltage applied to word line WL2 is also applied to the gate terminal of memory cell 122. Likewise, the ground potential applied to bit line BLTL1 is also applied to the source terminal of memory cell 122 and the voltage applied to bit line BLTL2 is also applied to the drain terminal of memory cell 122.

Memory cell 122 can be erased by applying a relatively high voltage to bit line BLTL1, i.e., the source terminal of memory cell 122, while grounding word line WL2, i.e., the gate terminal of memory cell 122, and allowing the bit line BLTL2, i.e., the drain terminal of memory cell 122, to float. The method for erasing memory cell 122 is not a limitation of the present invention.

Figure 3:
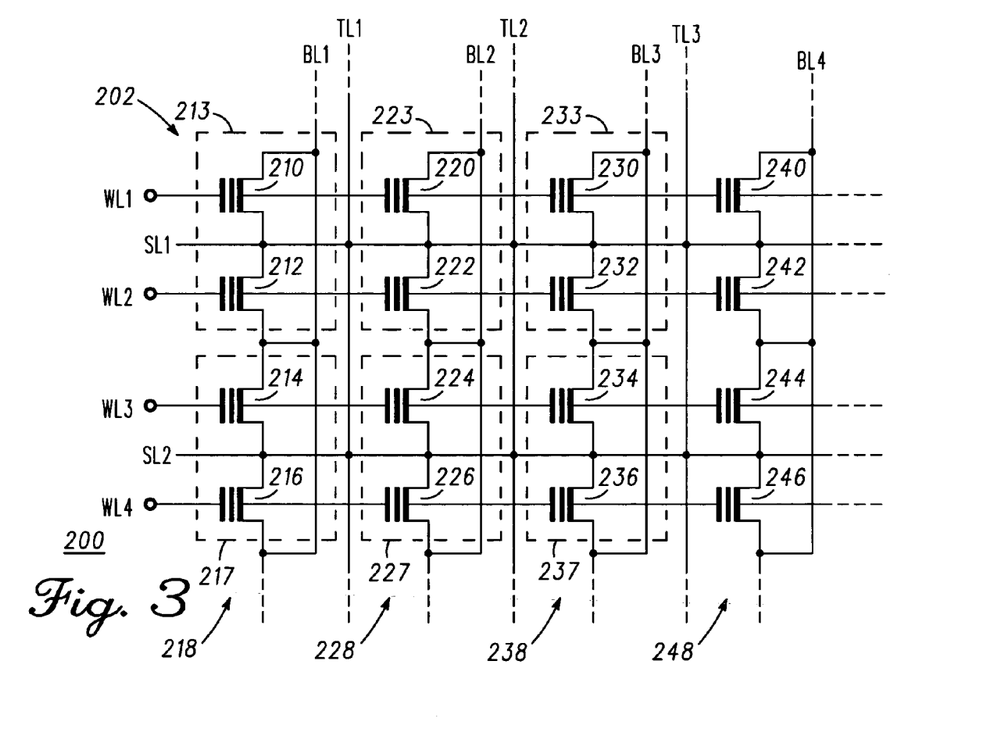
FIG. 3 is a schematic diagram of a portion of a memory array in accordance with another embodiment of the present invention.

FIG. 3 is a schematic diagram illustrating a sub-array 200 of a memory array in a NOR type circuit architecture in accordance with another embodiment of the present invention. Sub-array 200 is a 4×4 sub-array of memory cells 202 arranged in columns and rows, where each memory cell of sub-array 200 has a drain terminal, a source terminal, and a gate terminal. It should be understood that the size of sub-array 200 or the size of the array of memory cells is not a limitation of the present invention. For example, sub-array 200 can be a portion of an 8×8 array of memory cells, a 16×16 array of memory cells, 32×32 array of memory cells, a 64×64 array of memory cells, a 128×128 array of memory cells, a 256×256 array of memory cells, a 512×512 array of memory cells, a 1024×10$^{24}$ array of memory cells, etc.

The columns of memory cells 202 are arranged along respective bit lines BL1, BL2, BL3, BL4, etc. More particularly, memory cells 210, 212, 214, and 216 of memory cell array 202 form a column 218 of memory cells along bit line BL1. Memory cells 220, 222, 224, and 226 of memory cell array 202 form a column 228 of memory cells along bit line BL2. Memory cells 230, 232, 234, and 236 of memory cell array 202 form a column 238 of memory cells along bit line BL3. Memory cells 240, 242, 244, and 246 of memory cell array 202 form a column 248 of memory cells along bit line BL4. Accordingly, memory cells 210 and 212 form a set 213 in which the source terminals of memory cells 210 and 212 are commonly connected to each other and memory cells 214 and 216 form a set 217 having their source terminals commonly connected to each other. Likewise memory cells 220 and 222 form a set 223, memory cells 224 and 226 form a set 227, memory cells 230 and 232 form a set 233, memory cells 234 and 236 form a set 237, etc.

The drain terminals of memory cells 210, 212, 214, and 216 are connected to bit line BL 1, the source terminals of memory cells 210 and 212 are connected to a source line SL1, and the source terminals of memory cells 214 and 216 are connected to a source line SL2. The drain terminals of memory cells 220, 222, 224, and 226 are connected to bit line BL2, the source terminals of memory cells 220 and 222 are connected to source line SL1, and the source terminals of memory cells 224 and 226 are connected to source line SL2. The drain terminals of memory cells 230, 232, 234, and 236 are connected to bit line BL3, the source terminals of memory cells 230 and 232 are connected to source line SL1, and the source terminals of memory cells 234 and 236 are connected to source line SL2. The drain terminals of memory cells 240, 242, 244, and 246 are connected to bit line BL4, the source terminals of memory cells 240 and 242 are connected to source line SL1, and the source terminals of memory cells 244 and 246 are connected to source line SL2. In addition, source lines SL1 and SL2 are connected to trench lines TL1, TL2, and TL3. Thus, source lines SL1 and SL2 and trench lines TL1, TL2, and TL3 are electrically connected to each other.

The gate terminals of memory cells 210, 220, 230, and 240 are connected to word line WL1. The gate terminals of memory cells 212, 222, 232, and 242 are connected to word line WL2. The gate terminals of memory cells 214, 224, 234, and 244 are connected to word line WL3. The gate terminals of memory cells 216, 226, 236, and 246 are connected to word line WL4.

Similar to sub-array 100, a memory cell of sub-array 200 is selected and either programmed, read, or erased by applying the appropriate voltages to the gate, drain, and source terminals of the desired memory cell. The desired memory cell is selected or accessed by applying high voltages to the word line and to the bit line to which the respective gate and drain terminals of the desired memory cell are connected and by applying a low voltage to the remaining word lines and bit lines. For example, if it is desired to select or access memory cell 234 shown in FIG. 3, a high voltage is applied to word line WL3, a low voltage is applied to word lines WL1, WL2, and WL4, a low voltage is applied to bit lines BL1, BL2, and BL4, and a ground potential is applied to source lines SL1 and SL2 and to trench lines TL1, TL2, and TL3. In addition to selecting the desired memory cell, the voltages applied to the word lines, bit lines, and source lines either programs, reads, or erases the selected memory cell. For example, memory cell 234 is programmed by applying a voltage ranging from about 5 volts to about 15 volts to word line WL3, connecting source lines SL1 and SL2 and trench lines TL1, TL2, and TL3 to ground, and applying a voltage to bit line BL3 that is sufficiently higher than the voltage applied to source line SL1 (i.e., the voltage applied to the source terminal of memory cell 234) to cause electrons to become trapped in the floating gate of memory cell 234.

Memory cell 234 is read by applying a control voltage to word line WL3 that is greater than the threshold voltage of an unprogrammed or erased memory cell, but less than the threshold voltage of a programmed memory cell. In addition, a ground potential is connected to source line SL2 and a voltage ranging from about one volt to about two volts is applied to bit line BL3. Because word line WL3 is connected to the control gate of memory cell 234, the voltage applied to word line WL3 is also applied to the gate terminal of memory cell 234. Likewise, the ground potential applied to source line SL2 is also applied to the source terminal of memory cell 234 and the voltage applied to bit line BL3 is also applied to the drain terminal of memory cell 234.

Memory cell 234 can be erased by applying a relatively high voltage to source line SL2, i.e., the source terminal of memory cell 234, while applying a voltage of ground potential to word line WL3, i.e., the gate terminal of memory cell 234, and allowing the bit line BL3, i.e., the drain terminal of memory cell 234, to float. The method for erasing memory cell 234 is not a limitation of the present invention.

Figure 4:
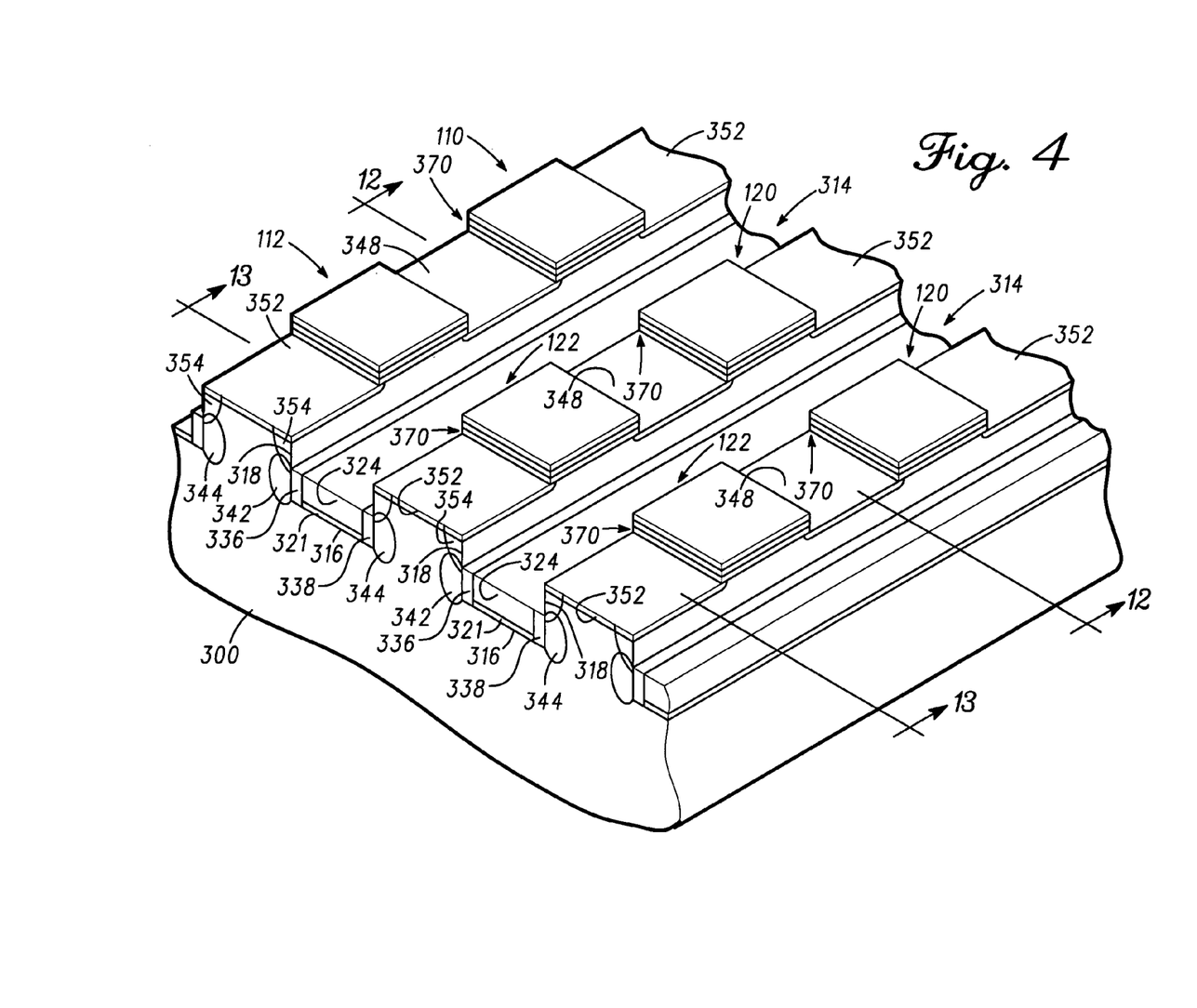
FIG. 4 is an isometric view of memory cells of the memory array of FIG. 2.

FIG. 4 is an isometric view of memory cells 110, 112, 120, 122, 130, and 132 of sub-array 100 of FIG. 2. What is shown in FIG. 4 is a semiconductor substrate 300 having a surface 302 and a plurality of trenches 314 extending from surface 302 into substrate 300. A dielectric material 321 is formed in trench 314 and a trench line 324 is formed on dielectric material 321. Polysilicon liners or inserts 336 and 338 are formed between each trench line 324 and its corresponding trench sidewall 318. Gate structures 370 comprising gate dielectric material and a conductive material are formed on surface 302. Source regions 348 and drain regions 352 are formed in semiconductor material 300. Doped regions 342 and 344 are formed adjacent corresponding sidewalls 318. Straps or connectors 354 connect doped regions 342 to drain regions 352. The manufacture of memory cells 110, 112, 120, 122, 130, and 132 shown in FIG. 4 are further shown and described with reference to FIGS. 5–13.

Figure 5:
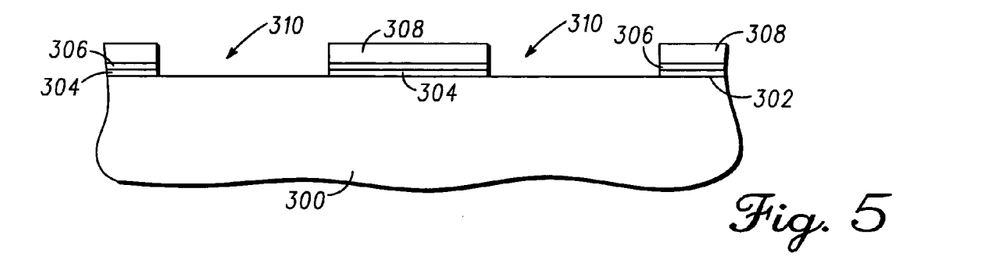
FIG. 5 is a cross-sectional side view of memory cells of the memory array of FIG. 2 taken along either section line 12—12 of FIG. 4 or section line 13—13 of FIG. 4.

Referring now to FIG. 5, a cross-sectional view of either memory cells 110, 120, and 130 of FIG. 2 taken along section line 12—12 of FIG. 4 or of memory cells 112, 122, and 132 of FIG. 2 taken along section line 13—13 of FIG. 4 is shown. It should be understood that the processing steps at the early stages of manufacture of memory cells 102 are the same for the source and drain regions. Thus, the cross-sectional view of FIG. 5 can represent a cross section taken along section line 12—12 or the cross section taken along section line 13—13. What is shown in FIG. 5 is semiconductor material 300 of P-type conductivity having a major surface 302. By way of example, semiconductor material 300 has a concentration ranging from about $1\times10^{14}$ atoms per centimeter cubed (atoms/cm$^3$) to about $2\times10^{14}$ atoms/cm$^3$. Although semiconductor material 300 is described as being silicon, it should be understood this is not a limitation of the present invention. Other suitable materials for substrate 300 include, but are not limited to, silicon germanium, germanium, Silicon-On-Insulator (SOI), and the like. The semiconductor material may also be a compound semiconductor material such as, for example, gallium arsenide, indium phosphide, and the like. The conductivity type of semiconductor material 300 is not a limitation of the present invention. In accordance with the present embodiment, the conductivity type is chosen to form an n-channel insulated gate semiconductor device. However, the conductivity type can be selected to form a p-channel insulated gate semiconductor device or a complementary insulated gate semiconductor device.

A layer of dielectric material 304 is formed on major surface 302. Preferably, dielectric layer 304 is oxide having a thickness ranging from about 50 Angstroms (Å) to about 250 Å. Oxide layer 304 can be either grown or deposited on semiconductor material 300. By way of example, oxide layer 304 is grown using a furnace process. Layer 304 is also referred to as a pad oxide layer or a pad layer.

Still referring to FIG. 5, a hardmask 306 having a thickness ranging from about 100 Å to about 5,000 Å is formed on dielectric layer 304. Preferably, hardmask 306 has a thickness ranging between about 500 Å and about 1,000 Å and comprises a single layer of a dielectric material such as, for example, silicon oxynitride (SiON), silicon nitride (SiN), silicon rich nitride (SiRN), silicon carbide (SiC), and hydrogenated oxidized silicon carbon material (SiCOH). It should be noted that hard mask 306 is not limited to being a single layer system, but can also be a multi-layer system. Hardmask 306 should comprise a material having a different etch rate or selectivity and a different thickness than oxide layer 304.

A layer of photoresist 308 is formed on hardmask 306. Photoresist layer 308 is patterned to form openings 310 using techniques known to those skilled in the art. The portions of hardmask 306 and dielectric layer 304 that are not protected by patterned photoresist layer 308, i.e., the portions exposed by openings 310, are etched using an anisotropic reactive ion etch to extend openings 310 and expose portions of surface 302. Photoresist layer 308 is removed using techniques known to those skilled in the art.

Figure 6:
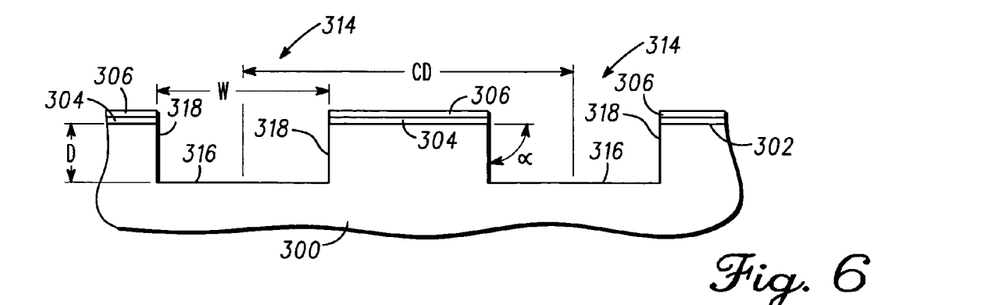
FIG. 6 is a cross-sectional side view of the memory cells of FIG. 5 further along in processing.

Referring now to FIG. 6, the exposed portions of semiconductor material 300 are anisotropically etched to form trenches 314 having floors 316 and sidewalls 318. The etch chemistry is selected so that sidewalls 318 form an angle $\alpha$ with surface 302 ranging from about 45 degrees to about 90 degrees. Preferably, the width (W) of trenches 314 ranges from about 500 Å to about 2,000 Å, the depth (D) of trenches 314 ranges from about 1,000 Å to about 5,000 Å, and the center-to-center distance (CD) between adjacent trenches ranges from about 500 Å to about 2,000 Å. Suitable techniques for forming trenches are known to those skilled in the art and may include, for example, Shallow Trench Isolation (STI) techniques.

Figure 7:
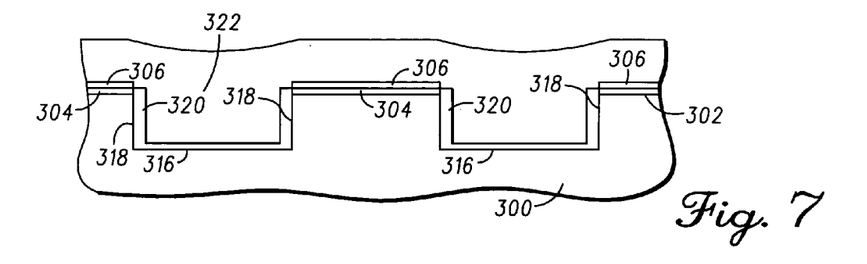
FIG. 7 is a cross-sectional side view the memory cells of FIG. 6 further along in processing.

Referring now to FIG. 7, a dielectric liner 320 is formed on floors 316 and sidewalls 318 of trenches 314. By way of example, dielectric liner 320 is oxide having a thickness ranging from about 50 Å to about 300 Å. A polysilicon layer 322 of N-type conductivity is formed on dielectric liner 320 and hardmask 306 using, for example, a chemical vapor deposition technique. Preferably, polysilicon layer 322 has a concentration of N-type dopants of greater than about $1 \times 10^{19}$ atoms/cm$^3$. Alternatively, polysilicon layer 322 may be doped with a dopant of P-type conductivity.

Figure 8:
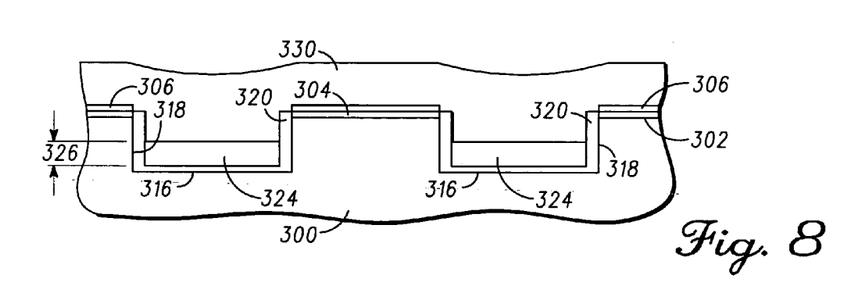
FIG. 8 is a cross-sectional side view the memory cells of FIG. 7 further along in processing.

Referring now to FIG. 8, polysilicon layer 322 is planarized using, for example, a Chemical Mechanical Planarization (CMP) technique having a high selectivity to hardmask 306. Hence, the planarization stops on hardmask 306. Other suitable planarization techniques include electropolishing, electrochemical polishing, chemical polishing, and chemically enhanced polishing. After planarization, a layer of photoresist (not shown) is patterned on hardmask 306 to expose the portions of polysilicon layer 322 disposed in trenches 314. The portions of polysilicon layer 322 disposed in trenches 314 are etched using, for example, a wet etchant to form trench lines 324. By way of example, the wet etchant is dilute hydrofluoric acid (HF). Preferably, the thickness of trench lines 324, indicated by arrows 326, ranges from about 200 Å to about 2,500 Å.

A layer of dielectric material 330 is formed on trench lines 324, oxide liner 320, and hardmask 306, and fills partially re-opened trenches 314. By way of example, dielectric layer 330 is oxide formed by the decomposition of tetraethylorthosilicate (TEOS). Dielectric material 330 is planarized using, for example, a CMP technique having a high selectivity to hardmask 306. Thus, the planarization stops on hardmask 306.

Figure 9:
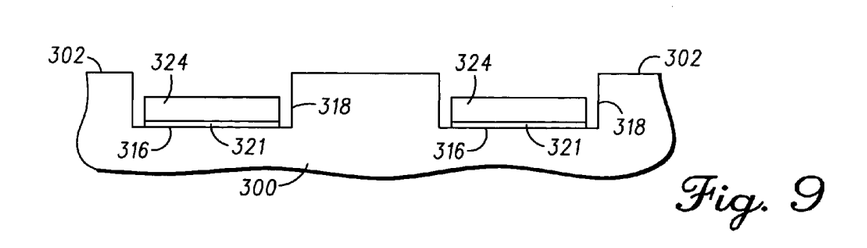
FIG. 9 is a cross-sectional side view the memory cells of FIG. 8 further along in processing.

Referring now to FIG. 9, hardmask 306 and the remaining portions of dielectric layer 304 are removed from major surface 302 using for example, a CMP technique. In addition, portions of dielectric material 330 are removed along with hardmask 306, thereby forming a planarized structure. Then, after the word lines have been patterned (perpendicular to the trench lines), the remaining portions of dielectric layer 330 and the portions of dielectric liner 320 along sidewalls 218 are removed using, for example, an anisotropic reactive ion etch that preferentially etches oxide. Preferably, only the portion 321 of dielectric liner 320 between each floor 316 and each trench line 324 remains after the anisotropic reactive ion etch.

Figure 10:
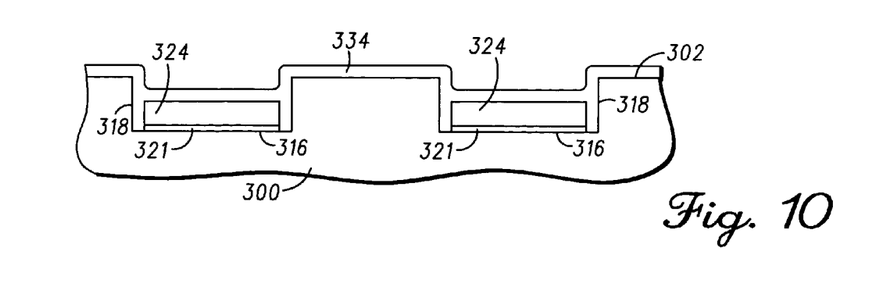
FIG. 10 is a cross-sectional side view the memory cells of FIG. 9 further along in processing.

Referring now to FIG. 10, an undoped polysilicon layer 334 is formed on trench lines 324, sidewalls 318, and major surface 302. By way of example, undoped polysilicon layer 334 is formed using a chemical vapor deposition technique and has a thickness ranging from about 75 Å to about 150 Å. It should be noted that undoped polysilicon layer 334 is also formed between each sidewall 318 and its associated trench line 324.

Figure 11:
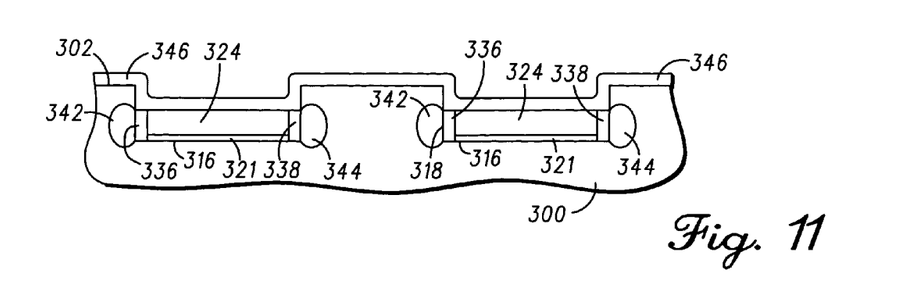
FIG. 11 is a cross-sectional side view the memory cells of FIG. 10 further along in processing.

Referring now to FIG. 11, undoped polysilicon layer 334 is anisotropically etched, leaving side regions or inserts 336 and 338 between sidewalls 318 and trench lines 324. Alternatively, polysilicon layer 334 is oxidized leaving inserts 336 and 338 between sidewalls 318 and trench lines 324. Because of the concentration gradient between trench lines 324 and side regions 336 and 338 and between side regions 336 and 338 and semiconductor substrate 300, the dopant in trench lines 324 diffuses through side regions 336 and 338 and into semiconductor material 300, thereby forming doped regions 342 and 344, respectively. A layer of dielectric material 346 is formed on semiconductor substrate 300, trench lines 324, the exposed portions of sidewalls 318, and on the exposed portions of side regions 336 and 338. Preferably, the formation of doped regions 342 and 344 is facilitated by forming dielectric layer 346 at temperatures sufficiently high to cause the dopant in trench lines 324 to laterally diffuse through side regions 336 and 338 and into substrate 300.

Figure 12:
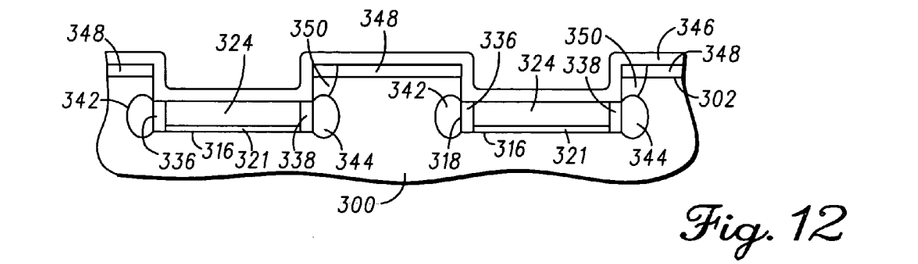
FIG. 12 is a cross-sectional side view the memory cells of FIG. 11 further along in processing.

Referring now to FIG. 12, a layer of photoresist (not shown) is patterned on dielectric layer 346 to have openings overlying trench lines 324 and the portions of semiconductor substrate 300 in which source regions will be formed. It should be understood that beginning at the step indicated in FIG. 12, the regions of semiconductor substrate 300 indicated by section lines 12—12 and 13—13 in FIG. 4 undergo different masking and doping steps from each other. In particular, the regions of semiconductor substrate 300 indicated by section line 12—12 become the source regions and the regions of semiconductor substrate 300 indicated by section line 13—13 become the drain regions. It should be further understood that the cross-sectional side view shown in FIG. 12 represents the source regions of memory cells 110, 120, and 130 shown in FIG. 2. Accordingly, FIG. 12 is a cross-sectional side view taken along the region indicated by section line 12—12. A dopant of N-type conductivity is implanted into semiconductor substrate 300 and trench lines 324 to form source regions 348 and to further dope source lines 324. The layer of photoresist is removed and another layer of photoresist (not shown) is patterned on dielectric layer 346 to have openings that expose the portions of dielectric layer 346 overlying and adjacent doped regions 344. A dopant of N-type conductivity is implanted through the openings to form doped regions 350, which serve as straps or connectors that connect doped regions 344 to corresponding source regions 348. Preferably, straps 350 are formed using an angled or tilt angle implant. The layer of photoresist is removed.

Figure 13:
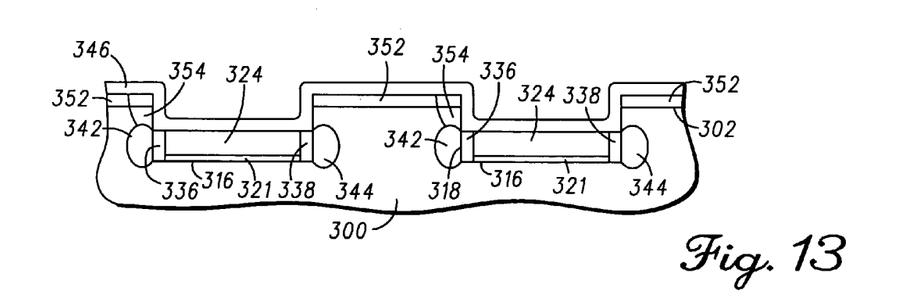
FIG. 13 is a cross-sectional side view the memory cells of FIG. 12 further along in processing.

Referring now to FIG. 13, a layer of photoresist (not shown) is patterned on dielectric layer 346 to have openings overlying trench lines 324 and the portions of semiconductor substrate 300 in which drain regions will be formed. It should be understood that FIG. 13 is a cross-sectional side view of the region of semiconductor substrate 300 taken along section line 13—13 of FIG. 4. A dopant of N-type conductivity is implanted into semiconductor substrate 300 and trench lines 324 to form drain regions 352 and to further dope source lines 324. The layer of photoresist is removed and another layer of photoresist (not shown) is patterned on dielectric layer 346 to have openings that expose the portions of dielectric layer 346 overlying and adjacent doped regions 342. A dopant of N-type conductivity is implanted through the openings to form doped regions 354, which serve as straps or connectors that connect doped regions 342 to corresponding drain regions 352. Preferably, straps 354 are formed using an angled or tilt angle implant. The layer of photoresist is removed.

Figure 14:
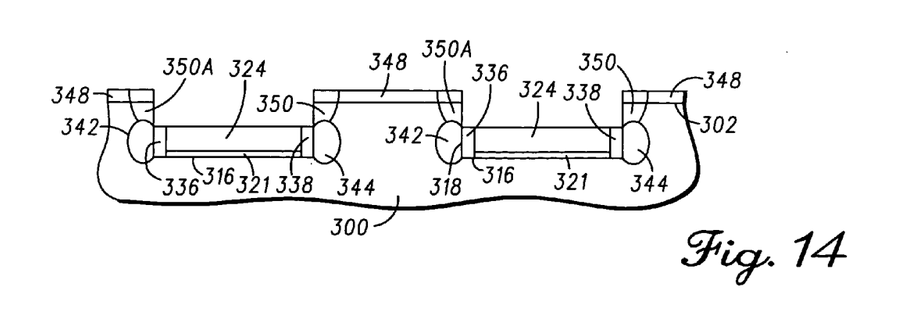
FIG. 14 is a cross-sectional side view the memory cells of FIG. 3 during processing.

Referring now to FIG. 14, an alternative embodiment showing a cross-sectional side view of a portion of the source regions of memory cells 202 of FIG. 3 is illustrated. In memory cells 202 of FIG. 3, straps 350A are formed on each side of trench lines 324. In other words, a strap 350A connects doped regions 342 and source regions 348 and a strap 350 connects doped regions 344 and source regions 348. It should be noted straps 350A may be formed contemporaneously with straps 350, hence the letter "A" has been appended to reference number 350 to distinguish the two straps.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
   a substrate having a major surface;
   a trench having first and second sidewalls extending from the major surface into the substrate;
   a first column of memory cells adjacent the first sidewall; and
   a trench line disposed in the trench, wherein the trench line is electrically coupled to the first column of memory cells.

2. The semiconductor component of claim 1, wherein the first column of memory cells comprises at least one memory cell having a gate structure, a drain region, and a source region.

3. The semiconductor component of claim 2, further including a first connector, wherein the first connector electrically couples one of the source region or the drain region to the trench line.

4. The semiconductor component of claim 3, further including a second connector, wherein the second connector electrically couples the other of the source region or the drain region to the trench line.

5. The semiconductor component of claim 3, wherein the trench line serves as a bit line.

6. The semiconductor component of claim 2, further including a drain connector, wherein the drain connector electrically couples the drain region of the at least one memory cell to the trench line.

7. The semiconductor component of claim 6, further including a source connector, wherein the source connector electrically couples the source region of the at least one memory cell to the trench line.

8. The semiconductor component of claim 2, further including a source connector, wherein the source connector electrically couples the source region of the at least one memory cell to the trench line.

9. The semiconductor component of claim 8, further including a second column of memory cells, wherein the second column of memory cells is adjacent the second sidewall and comprises at least one memory cell having a gate structure, a drain region, and a source region.

10. The semiconductor component of claim 8, further including another drain connector, wherein the another drain connector electrically couples the drain region of the at least one memory cell of the second column of memory cells to the trench line.

11. The semiconductor component of claim 8, further including another source connector, wherein the another source connector electrically couples the drain region of the at least one memory cell of the second column of memory cells to the trench line.

12. The semiconductor component of claim 1, further including a second column of memory cells, wherein the second column of memory cells is adjacent the second sidewall and comprises at least one memory cell having a gate structure, a drain region, and a source region.

13. A memory device, comprising:
   a first memory cell having a gate structure, a drain region, and a source region, the gate structure disposed on a semiconductor substrate;
   a second memory cell having a gate structure, a drain region, and a source region, the gate structure of the second memory cell disposed on the semiconductor substrate and wherein the source region of the second memory cell is coupled to the source region of the first memory cell, and wherein the first and second memory cells cooperate to form a first column of memory cells;
   a first trench adjacent the first column of memory cells the first trench extending into the substrate; and
   a first trench line disposed in the first trench, wherein the source regions of the first and second memory cells are coupled to the first trench line.

14. The memory device of claim 13, further including a second trench adjacent the first column of memory cells, the second trench extending into the substrate and a second trench line disposed in the second trench, wherein the drain regions of the first and second memory cells are coupled to the second trench line.

15. The memory device of claim 14, further including:
   a third memory cell having a gate structure disposed on the semiconductor substrate, a drain region, and a source region; and
   a fourth memory cell having a gate structure disposed on the semiconductor substrate, a drain region, and a source region, wherein the source region of the fourth memory cell is coupled to the source region of the third memory cell and the source regions of the third and fourth memory cells are coupled to the second trench line, and wherein the third and fourth memory cells cooperate to form a second column of memory cells.

16. The memory device of claim 15, wherein the second trench line is between the first and second columns of memory cells.

17. The memory device of claim 15, further including a third trench adjacent the second column of memory cells the third trench extending into the substrate and a third trench line disposed in the third trench.

18. The memory device of claim 17, wherein the drain regions of the third and fourth memory cells are coupled to the third trench line.

19. The memory device of claim 18, wherein the first trench line serves as a first bit line, the second trench line serves as a second bit line, and the third trench line serves as a third bit line.

20. The memory device of claim 15, further including a first bit line coupled to the drain regions of the first and second memory cells.

21. The memory device of claim 20, further including a second bit line coupled to the drain regions of the second and third memory cells.

22. The memory device of claim 13, further including a first bit line coupled to the drain regions of the first and second memory cells.

* * * * *